(12) United States Patent
Kim et al.

(10) Patent No.: US 10,592,632 B2
(45) Date of Patent: Mar. 17, 2020

(54) METHOD FOR ANALYZING DESIGN OF AN INTEGRATED CIRCUIT

(71) Applicant: IMEC VZW, Leuven (BE)

(72) Inventors: Ryan Ryoung han Kim, Bertem (BE); Jae Uk Lee, Heverlee (BE)

(73) Assignee: Imec vzw, Leuven (BE)

( * ) Notice: Subject to any disclaimer, the term of this patent is extended or adjusted under 35 U.S.C. 154(b) by 100 days.

(21) Appl. No.: 15/957,409

(22) Filed: Apr. 19, 2018

(65) Prior Publication Data

US 2018/0307792 A1 Oct. 25, 2018

(30) Foreign Application Priority Data

Apr. 21, 2017 (EP) ..................................... 17167587

(51) Int. Cl.
*G06F 17/00* (2019.01)
*G06T 7/00* (2017.01)
(Continued)

(52) U.S. Cl.
CPC ...... *G06F 17/5081* (2013.01); *G03F 7/70433* (2013.01); *G06F 17/5072* (2013.01); *G06N 3/088* (2013.01); *G06T 7/0006* (2013.01); *G06F 3/147* (2013.01); *G06T 2207/20021* (2013.01); *G06T 2207/20056* (2013.01);
(Continued)

(58) Field of Classification Search
CPC ..... G06F 17/5081; G06F 3/147; G06N 3/088; G06T 7/0006; G06T 2207/20021; G06T 2207/20056; G06T 2207/20081; G06T 2207/20084; G06T 2207/30148
See application file for complete search history.

(56) References Cited

U.S. PATENT DOCUMENTS

2008/0189667 A1* 8/2008 Pikus .................. G06F 17/5081
716/52
2009/0106715 A1* 4/2009 Pikus .................. G06F 17/5081
716/106
(Continued)

OTHER PUBLICATIONS

Sun, Zhiwei, "A Hierarchical Clustering Algorithm Based on Density for Data Stratification", 2012 International Conference on Systems and Informatics (ICSAI), May 19, 2012, pp. 2208-2211.
(Continued)

*Primary Examiner* — Ping Y Hsieh
(74) *Attorney, Agent, or Firm* — McDonnell Boehnen Hulbert & Berghoff LLP

(57) ABSTRACT

Methods and systems for analyzing design of an integrated circuit are described. An example method includes receiving a design layout for an integrated circuit and forming a plurality of images of portions of the design layout. The method also includes, for each image of a portion of the design layout, calculating a Fourier transform representation of the image and extracting values of pre-defined parameters from the Fourier transform representation. The method also includes comparing the extracted parameter values of the plurality of images to create a clustering model by unsupervised machine learning and to sort each image of a portion of the design layout into a cluster defined by the clustering model. The method also includes determining a number of images sorted into at least one cluster defined by the clustering model.

18 Claims, 7 Drawing Sheets

(51) Int. Cl.
*G06F 17/50* (2006.01)
*G06N 3/08* (2006.01)
*G03F 7/20* (2006.01)
*G06F 3/147* (2006.01)

(52) U.S. Cl.
CPC .............. *G06T 2207/20081* (2013.01); *G06T 2207/20084* (2013.01); *G06T 2207/30148* (2013.01)

(56) References Cited

U.S. PATENT DOCUMENTS

| | | | | |
|---|---|---|---|---|
| 2015/0213374 | A1* | 7/2015 | Agarwal | G06F 17/50 706/12 |
| 2016/0110858 | A1* | 4/2016 | Liu | G06T 7/41 382/149 |
| 2016/0378902 | A1* | 12/2016 | Graur | G06F 17/5081 716/52 |

OTHER PUBLICATIONS

European Search Report, European Patent Application No. 17167587.9, dated Oct. 20, 2017, 8 pages.

\* cited by examiner

METHOD FOR ANALYZING DESIGN OF AN INTEGRATED CIRCUIT

CROSS-REFERENCE TO RELATED APPLICATIONS

The present application is a non-provisional patent application claiming priority to EP Patent Application No. 17167587.9, filed Apr. 21, 2017, the contents of which are hereby incorporated by reference.

FIELD OF THE DISCLOSURE

The present disclosure relates to analyzing designs of integrated circuits and a device for designing an integrated circuit.

BACKGROUND

Integrated circuit production involves facilities that are expensive to build and maintain. Thus, it is common that integrated circuit production is performed at a foundry, which is specialized in production of integrated circuits, whereas design of the integrated circuits may be performed separately by a design house. The design house provides a design of the integrated circuit to the foundry, which then produces the integrated circuit.

The preparation of production process for an integrated circuit is a tedious task. Optical proximity correction (OPC) is performed at the foundry to ensure that the integrated circuit to be produced closely resembles the design. Then, hotspot analysis can be made to identify areas of the design in which lithographic printing errors are likely to be produced.

Based on failure of the hotspot analysis, OPC may be updated before another hotspot analysis is performed. Once a hotspot analysis is passed, a production test may be made and wafer verification may be performed to ensure that yield of the integrated circuit production is acceptable. Here, yield related design errors may be discovered. Thus, it may take a substantial amount of time (e.g., 4 months or more) and resources to discover design errors before an indication may be given to the design house that a re-design is required.

Attempts have been made at improving detection of lithographic hotspots using machine learning. In US 2015/0213374, a mechanism for detecting lithographic hotspots is disclosed. This mechanism utilizes extracted features on a set of training samples to train a machine learning classifier model. The machine learning may then use a set of known hotspots to train a machine learning model and uses the model to detect hotspots. Thus, in order to train the machine learning model, sets of known hotspots are required.

The use of machine learning for hotspot detection only detects errors based on hotspots and needs to include training based on known hotspots. Thus, the aid in designing of the integrated circuit still needs to be based on interaction with a foundry. Thus, it may still take substantial time before, e.g., yield errors for other reasons than hotspots are discovered, and a designer may not get input on a quality of the design without interaction with the foundry.

It would be desired to enable analysis of a design at the design house in order to improve quality of designs produced by the design house and without requiring interaction with a foundry (which may be time-consuming).

SUMMARY

An example objective of the present disclosure is to improve analysis of designs of integrated circuits and to enable analysis of designs without need of input from a foundry.

According to a first aspect of the present disclosure, a method for analyzing design of an integrated circuit is provided. The method comprises: receiving a design layout for an integrated circuit; forming a plurality of images of portions of the design layout, and for each image of a portion of the design layout: calculating a Fourier transform representation of the image; and extracting values of pre-defined parameters from the Fourier transform representation; comparing the extracted parameter values of the plurality of images to create a clustering model by unsupervised machine learning and to sort each image of a portion of the design layout into a cluster defined by the clustering model; and determining a number of images sorted into at least one cluster defined by the clustering model.

The method enables analysis of a design of an integrated circuit to be performed separately from a foundry. Thus, the method allows a designer to receive immediate feedback on a design, which may considerably speed up the time of reaching tape-out of the design. Also, by receiving feedback on the design, the designer may learn from results of his/her design style and gain designing habits which are more likely to provide high quality designs.

Further, the analysis is not based on training in relation to particular types of errors, such as hotspots, which implies that the design analysis will not be limited to identification of such particular types of errors. Rather, the analysis may form a clustering of portions of the design layout so that major patterns (i.e., many occurrences in the design) and minor patterns (i.e., few occurrences in the design) in the design may be identified. In particular, by identifying minor patterns, which are not commonly occurring in the design layout, problems in the design layout may be easily identified, without a necessity to compare the patterns to a model formed by training the machine learning method.

Unsupervised machine learning is a machine learning task of analyzing and describing a structure based on unlabeled data (i.e., a classification or categorization is not included in the data). This implies that the machine learning is performed solely based on the extracted parameters to find clusters within the data set constituted by the images and there is no previous training required for sorting the images into clusters.

In accordance with the present disclosure, parameters extracted from a Fourier transform representation of images may appropriately cluster portions of the design based on parameters that are relevant to a quality of the design. Thus, the extraction of the parameters may allow clustering the design into relevant clusters and identifying quality measures of the design without a necessity to compare the portions of the design to classifications based on training a machine learning model.

The clustering may be able to extract information about the quality of the design and, by identifying numbers of images in clusters, occurrences of minor patterns in the design may indicate a quality of the design. A designer may use the information to change designs so as to change distribution of occurrences in clusters and may hence use the method as a tool in evaluating a design and comparing designs to each other. The designer may use the analysis continuously during several iterations of a design phase until a satisfactory distribution of patterns is achieved before the design is forwarded to a foundry.

The number of images (corresponding to portions of the design) in minor patterns may be of particular interest, as it is the minor patterns that may be particularly likely to cause problems in the production of the integrated circuit. Thus, the method may include determining the number of images sorted into at least cluster(s) having a relatively small population of images.

The method allows forming the plurality of images based on a window size of images rather than in relation to a pattern in the design (e.g., such as edges in the pattern). Thus, the method is not dependent on correctly identifying edges in a pattern for forming portions of the design to be analyzed.

The sorting of images into clusters defined by a clustering model implies that information on the design is extracted. The method therefore facilitates using the extracted information for giving feedback to a designer on a quality of the design. For instance, the extracted information may be used for visualizing quality features of the design so as to allow a designer to review the extracted information. Additionally or alternatively, the extracted information may be further processed (e.g., for calculating a quality score).

The method may be performed by a data processing unit. The method may be performed by executing computer instructions on the data processing unit.

The Fourier transform representation implies that a representation based on a Fourier transform is calculated. Thus, a fast Fourier transform (FFT) may be calculated, which may be efficiently used in a computer-implementation.

According to an embodiment, the method further comprises calculating at least one quality score of the design based on the created clustering model and the determined number of images in the at least one cluster. The quality score may allow quantitatively defining a quality of the design, so that the quality may be compared to other designs, or a below-par quality may be identified.

According to an embodiment, the at least one quality score is based on a number of clusters in the clustering model and a density value of determined number of images in each cluster. The number of clusters may indicate a distribution in different kinds of patterns in the design, where few clusters may be an indication of a good quality. In an example, the density value of images in each cluster may provide information of populations of minor patterns, so as to indicate how often minor patterns occur in the design.

The quality score may also include processing images in one or more clusters using an image processing algorithm, such as pattern recognition. The image processing may be performed on the image formed from the design layout, but may alternatively be performed on an image which is reconstructed based on the extracted parameters of the Fourier transform representation. In an example, pattern recognition may be performed to determine similarity to undesired designs and a quality score may be based on a degree of similarity.

According to an embodiment, the at least one quality score is compared to at least one pre-defined threshold and the method further includes, based on a result of the comparison, outputting a recommendation to re-design the design layout for the integrated circuit. This implies that the method may allow identifying when quality of the design calls for re-design, so as to immediately provide feedback that further design work is needed. This substantially speeds up a process of designing an integrated circuit, as design layouts not passing the quality control do not proceed to a foundry for further evaluation.

According to an embodiment, the method further comprises outputting the determined number of images of the at least one cluster for presentation in a diagram on a display. The presentation may be made in a manner suitable to allow a designer to make sense of the analysis of the design. Thus, the presentation may take the form of, e.g., a histogram over occurrences of images in respective clusters, a Venn diagram, a density graph or a table. This may allow visualizing the information extracted by the analysis, such that a designer may easily identify design concerns.

According to an embodiment, the method further comprises: reconstructing an image based on extracted parameter values by calculating an inverse Fourier transform using the extracted parameter values; and outputting the reconstructed image for presentation on a display. The reconstructed image may thus illustrate kinds of patterns that are sorted into each cluster. By viewing minor patterns, a designer may identify whether the minor patterns may cause trouble in yield of the integrated circuit production.

According to an embodiment, the comparing of the extracted parameter values uses different parameter weights for different parameters. The method may further comprise receiving input for changing parameter weights and repeating the comparing of the extracted parameter values based on changed parameter weights.

A designer may be allowed to define which type of characteristics of the design that may be of particular importance, such as feature size, density of features and shape of features in the integrated circuit. The designer may indicate that one or more such characteristics are important (e.g., should be given a high weight) and the method may convert such input to appropriate parameter weights corresponding to the important characteristics. This facilitates providing input by a designer, as the designer need not fully understand the correspondence of extracted parameters to the characteristics of the integrated circuit in order to request forming of the clustering model with a desired focus.

According to an embodiment, calculating a Fourier transform representation of the image comprises forming at least one envelope along a cross-sectional direction intersecting origin of a two-dimensional Fourier transform of the image. By using the Fourier transform, parameters may be extracted which are relevant for analyzing characteristics of the design. By forming an envelope in one dimension of the Fourier transform, major information in the Fourier transform may be represented by a few parameters. Hence, forming of at least one envelope is helpful in efficiently extracting relevant parameters to be used by the unsupervised machine learning.

The Fourier transform may be represented as a two-dimensional pattern in Cartesian coordinates (i.e., providing frequency information in different directions of the image). The envelope may then be formed in relation to the Fourier transform values along an axis of the representation in Cartesian coordinates, thus passing through origin of the two-dimensional Fourier transform. However, in other examples the Fourier transform may be represented in polar coordinates instead. Additionally or alternatively, the envelope may be formed using only values in a quadrant of the coordinate plane.

According to an embodiment, the pre-defined parameters include at least one in the group of: a zeroth order intensity of the at least one envelope, a first order intensity of the at least one envelope, and a distance between a peak of the zeroth order and a peak of the first order of the at least one envelope.

By using these parameters, input is given to the machine learning such that a clustering can be performed without need of training in relation to known patterns. The use of these parameters extracts information from the image of a portion of a design, such that the portion may be analyzed with respect to quality of design. In an example, the analysis may not give immediate feedback of risks for hotspots, but may at least identify portions of the design differentiating from other portions with respect to features affecting producibility of the design. By this use of relevant, pre-defined parameters, the unsupervised machine learning may form clusters from the images that are relevant to further analyze.

The Fourier transform may be considered a diffraction pattern based on the image. Thus, a "zeroth order intensity" should be understood as a peak intensity which is present at a center (origin) of the Fourier transform. The first order should be understood as a peak closest to the zeroth order peak in a given direction of the envelope.

The zeroth order intensity of an envelope may provide an indication of brightness of an image and, hence, a density of features in the portion of the design represented by the image. A distance between a peak of the zeroth order and a peak of the first order may provide an indication of small frequencies in the image (i.e., large spatial features). Hence, the distance may be an indication of feature sizes and shapes in the design. Thus, the extracted parameters may provide measures of feature size, density of features and shapes of features that may be used for analyzing the design.

According to an embodiment, envelopes may be formed along coordinate axes of the Fourier transform. Thus, two envelopes may be formed and nine parameters may be extracted by considering the zeroth order intensity as well as the first order (intensity and distance to the zeroth order) in each direction along the coordinate axes from the origin. These nine parameters may be used as an input to the unsupervised machine learning for clustering images.

In example embodiments, other parameters of the Fourier transform may be used in addition or instead of the above defined parameters. For instance, in addition to using parameters from an envelope, information inside an envelope curve may also be used, such as peaks within the envelope curve (e.g., local peaks within the zeroth order identified by the envelope curve).

According to an embodiment, forming of a plurality of images of portions of the design layout comprises forming a binary image of a layer of the design layout. Thus, a layer of the design layout may be considered at a time. The design layout may be converted to a binary image differentiating between pattern and spaces between patterns. This implies that the patterns formed by the design may be simplified and, hence, limiting information used in the image analysis of the design.

According to an embodiment, forming of a plurality of images of portions of the design layout further comprises cutting the binary image into a plurality of images of portions of the binary image. This cutting of the binary image enables analysis of portions of the design layout, such that each portion may be separately analyzed. The analysis of the design layout may thus ensure that patterns throughout the design are appropriate for production of the integrated circuit.

According to an embodiment, the cutting of the binary image forms overlapping images with a size of the images being dependent on the layer of the design layout. Thanks to using overlapping images, the images are complementary and ensure that patterns which may otherwise extend over an edge between adjacent images are also taken into account.

Two subsequent cut images in a direction of the design layout may typically be arranged to have an overlap that corresponds to half the size of the image. This implies that patterns across an entire area of the design layout may be properly analyzed. However, in example embodiments the overlap may be larger or smaller.

According to an embodiment, forming of a plurality of images of portions of the design layout further comprises enlarging a size of a cut image by zero-padding.

The zero-padding facilitates calculating of the Fourier transform as features are not present at the edges of the image. Thus, a frame of zeros is added around the cut image in order to simplify calculations that are to follow.

According to a second aspect of the present disclosure, a computer program product is provided. The computer program product comprises a non-transitory computer-readable medium with computer-readable instructions such that when executed on a processing unit the computer program product will cause the processing unit to perform the method according to the first aspect of the present disclosure.

Effects and features of this second aspect are largely analogous to those described above in connection with the first aspect. Embodiments mentioned in relation to the first aspect are largely compatible with the second aspect.

The computer program product may be used as a plug-in to a design software, such as an electronic design automation (EDA) software for designing an integrated circuit or a standalone software for use in conjunction with a design software.

According to a third aspect of the present disclosure, a device for designing of an integrated circuit is provided. The device comprises: a processing unit, which is configured to execute processing instructions to implement: a design tool for designing a layout for an integrated circuit and outputting a design layout; and a design analytics tool, wherein the design analytics tool is configured to: receive a design layout for an integrated circuit; form a plurality of images of portions of the design layout, and for each image of a portion of the design layout: calculate a Fourier transform representation of the image; and extract values of pre-defined parameters from the Fourier transform representation; compare the extracted parameter values of the plurality of images to create a clustering model by unsupervised machine learning and to sort each image of a portion of the design layout into a cluster defined by the clustering model; and determine a number of images sorted into each cluster defined by the clustering model.

Effects and features of this third aspect are largely analogous to those described above in connection with the first and second aspects. Embodiments mentioned in relation to the first and second aspects are largely compatible with the third aspect.

The device may thus provide a design tool for designing a layout for an integrated circuit as well as a design analytics tool. Thus, the device may enable a designer to directly analyze a design within the design tool so as to immediately determine a quality of the design. Hence, a process for reaching production of a new design for an integrated circuit may be significantly accelerated as the number of iterations between a design house and a foundry may be reduced or even eliminated.

BRIEF DESCRIPTION OF THE FIGURES

The above, as well as additional, features will be better understood through the following illustrative and non-limiting detailed description of example embodiments, with reference to the appended drawings. In the drawings like reference numerals will be used for like elements unless stated otherwise.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
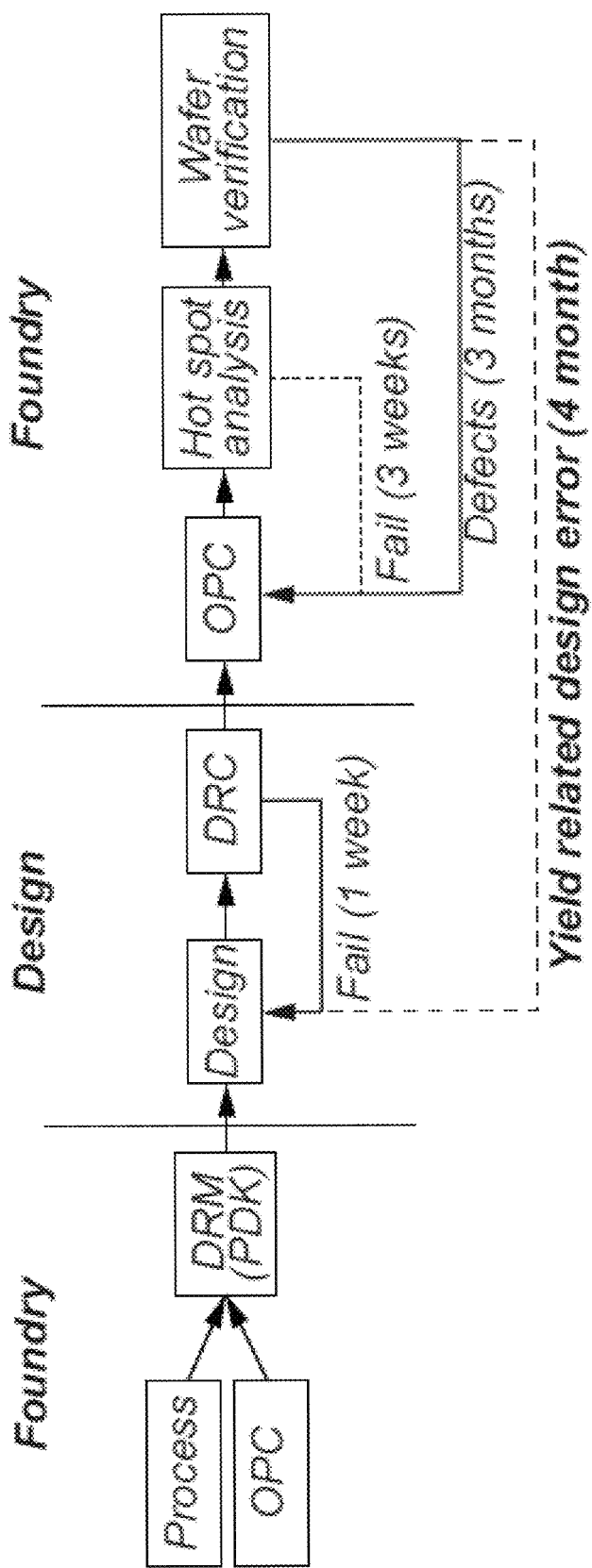
FIG. 1 is a schematic view of a process for designing and preparing an integrated circuit for production.

FIG. 1 is a schematic view of a process for developing an integrated circuit. A foundry produces integrated circuits. The foundry may inform a design house of process characteristics and optical proximity correction (OPC) used by the foundry, by forming a design rule manual (DRM). The DRM may be used as input to designers at the design house to ensure that a desired integrated circuit is produced based on the design layout.

The design house may thus use a design tool, typically an electronic design automation (EDA) software for creating design layouts. When a design layout is prepared, a design rule check (DRC) and mask manufacturing rule check (MRC) may be performed to determine whether the design layout appears to meet requirements for properly producing the integrated circuit. If the design layout fails DRC and/or MRC, a re-design may be needed before the design layout may be forwarded to the foundry.

Once the design layout is set, the foundry receives the design layout and may perform several steps (and iterations) of testing before a design may reach tapeout and be ready for production. This involves OPC, hotspot analysis and wafer verification. It may take a considerable amount of time and resources to find if there is a yield-related design error. Thus, it would be desirable to improve analysis of designs at the design house to at least reduce a risk of the foundry finding that there is a yield-related design error that may require re-designing of the design layout.

The present disclosure provides a machine learning design analyzer (MLDA), which is a design analytics tool that enables analyzing of the design layout at the design house. A designer using the design analytics tool may be provided with immediate feedback on the design, so that the designer may learn habits and improve designing skills. Also, the design analytics tool may inform the designer of potential problems in production of a designed integrated circuit, so as to reduce a risk that the design may need to be re-designed after testing at the foundry.

The MLDA may be independent of a DRM or process of the foundry and may provide an analysis of the design as such. This implies that the designer may be provided with information on designing skills that is generic to any foundry. The MLDA may be provided as a plug-in or integrated with a EDA software, but it could also be an independent software that provides information on the design layout.

Figure 2:
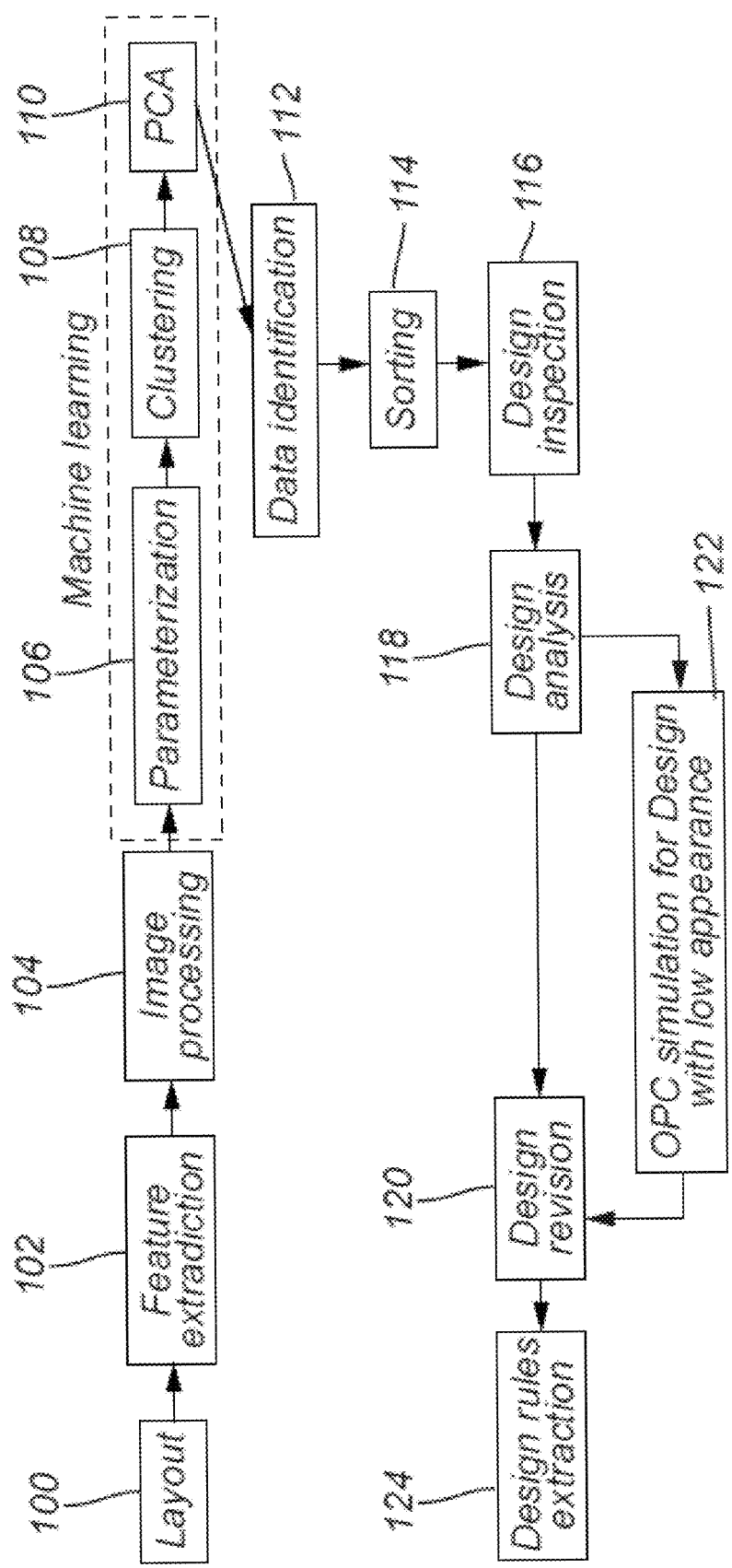
FIG. 2 is a flow chart of a method for analyzing a design layout, according to an example embodiment.

Referring now to FIG. 2, an overview of a method performed in relation to the design analysis will be described. The method may at least partly be implemented in an MLDA tool.

First, a design layout of an integrated circuit is received, step 100. The design layout may be provided from an EDA software and may be provided in any suitable format. The design layout may be provided as a Graphic Design System (GDS) file, an Open Artwork System Interchange Standard (OASIS) file, or any other type of file that may carry a design layout.

An image of the design layout may be extracted from the file, e.g. as a bitmap file, which may then be converted to a binary image representing pattern and spaces as ones and zeros, respectively. The binary image may be cut into a large number of images of portions of the design layout, so as to extract features, step 102, of the design layout.

The images of the portions of the design layout may be processed, step 104, by an image processing algorithm, using a Fourier transform to generate a Fourier transform representation of the image. The Fourier transform representations of the images may then be input into a machine learning algorithm for analyzing the design layout.

The machine learning algorithm may extract parameters, step 106, from each of the images to provide relevant characteristics of each portion of the design layout. The parameters extracted from each image may then be input to a clustering method, step 108, which performs unsupervised machine learning on the dataset provided by the parameters from each image in order to find clusters in the dataset. The clustering may use a number of different ways of dividing the parameters into clusters, such as principal component analysis (PCA), step 110.

Once the clusters have been formed, the images may be processed, step 112, in relation to the clusters and sorted, step 114, into a cluster in the clustering model. Hence, the images are grouped into a number of clusters, which allows further analysis of the design layout.

The images sorted into clusters may then be used for inspection of the design, step 116. The design inspection may involve visualization (e.g., graphic presentation) of the clusters and occurrences of images (e.g., portions of the design layout) in each cluster. Hence, the visualization may provide a way for a designer to understand a quality of a design, e.g. by visually seeing how many minor patterns are present in the design.

The sorting of the images into clusters may also be used for performing a quantitative analysis, step 118. Thus, at least one quality score may be calculated based on the clustering of the images. The at least one quality score may be based on the number of clusters and/or on the number of images in at least one cluster (especially in clusters representing minor patterns).

The at least one quality score may be compared to a threshold(s) to determine whether the quality of the design is insufficient. Thus, based on the design analysis and/or the design inspection, a decision to revise the design may be made. The design may thus be revised, step 120, and the process may be re-iterated based on the revised design.

According to one example, a quality score may be based on a weighted sum of characteristics in the clustering model in order to determine whether undesired patterns are present in the design to a large extent. Thus, a quality score may be given by a weighted sum of a density (occurrences) of images in a cluster and one or more extracted parameters from the images (wherein each extracted parameter may be given its own weight), such as zeroth order intensity and a distance between a zeroth order peak and a first order peak.

Also, the design analysis may identify minor patterns that may need further analysis and OPC simulation may be performed, step 122, for such portions of the design having few occurrences. Based on the OPC simulation, a decision that the design may need to be revised may be made.

Once the design passes the analysis, the design may move to design rules extraction, step 124, and DRC and/or MRC may be performed on the design layout before the design layout may then be forwarded to the foundry.

The MLDA may provide a visualization of the design, so as to allow intuitive understanding of the analysis performed by the tool. The MLDA may thus be configured to calculate the number of images in at least one cluster of the clustering model. In one embodiment, the number of images in clusters representing minor patterns is calculated. In another embodiment, the number of images in each cluster is calculated.

By means of the calculated number of images in the clusters, the information may be output for presentation and visualization to a designer. Based on the calculated number of images in the clusters, charts or diagrams may be created, which may be output for presentation on a display.

Figure 3:
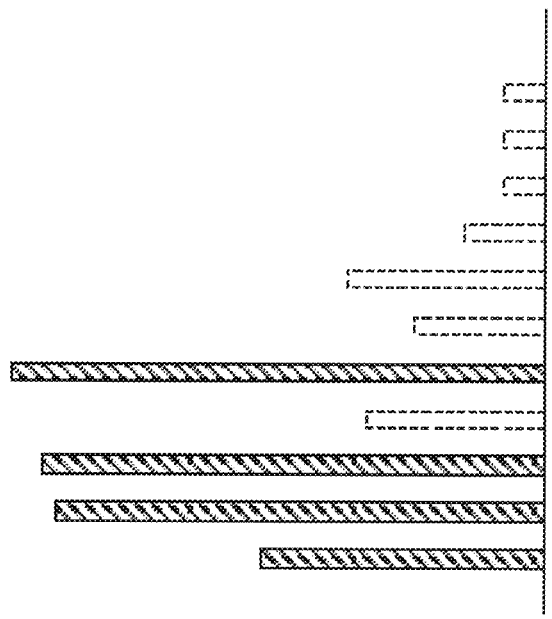
FIG. 3 shows charts illustrating cluster distribution for different design layouts, according to an example embodiment.
Figure 3:
Figure 3:
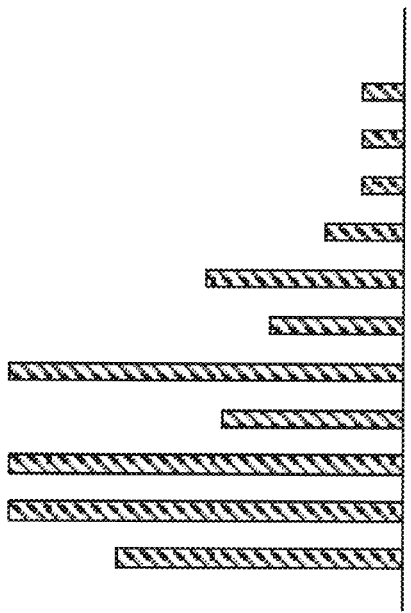

The visualization of characteristics of the design layout may allow a designer to decide that a re-design may be desirable. As illustrated in FIG. 3, the MLDA may be used for triggering a designer to change the design so that distributions of images (representing portions of the design) in the clusters may be moved from a distributed design (as illustrated in left part of FIG. 3) to a consolidated design with fewer types of patterns (as illustrated in right part of FIG. 3).

The design inspection may also include reconstructing an image of a portion of the design based on the extracted parameters of the Fourier transform. Thus, the reconstructed image may be displayed to a designer so that the designer may view e.g. the minor patterns for determining whether a re-design is desirable based on the appearance of the minor patterns. Alternatively, a portion of the binary image corresponding to the pattern may be output for display, e.g. on request by a user.

Figure 4:
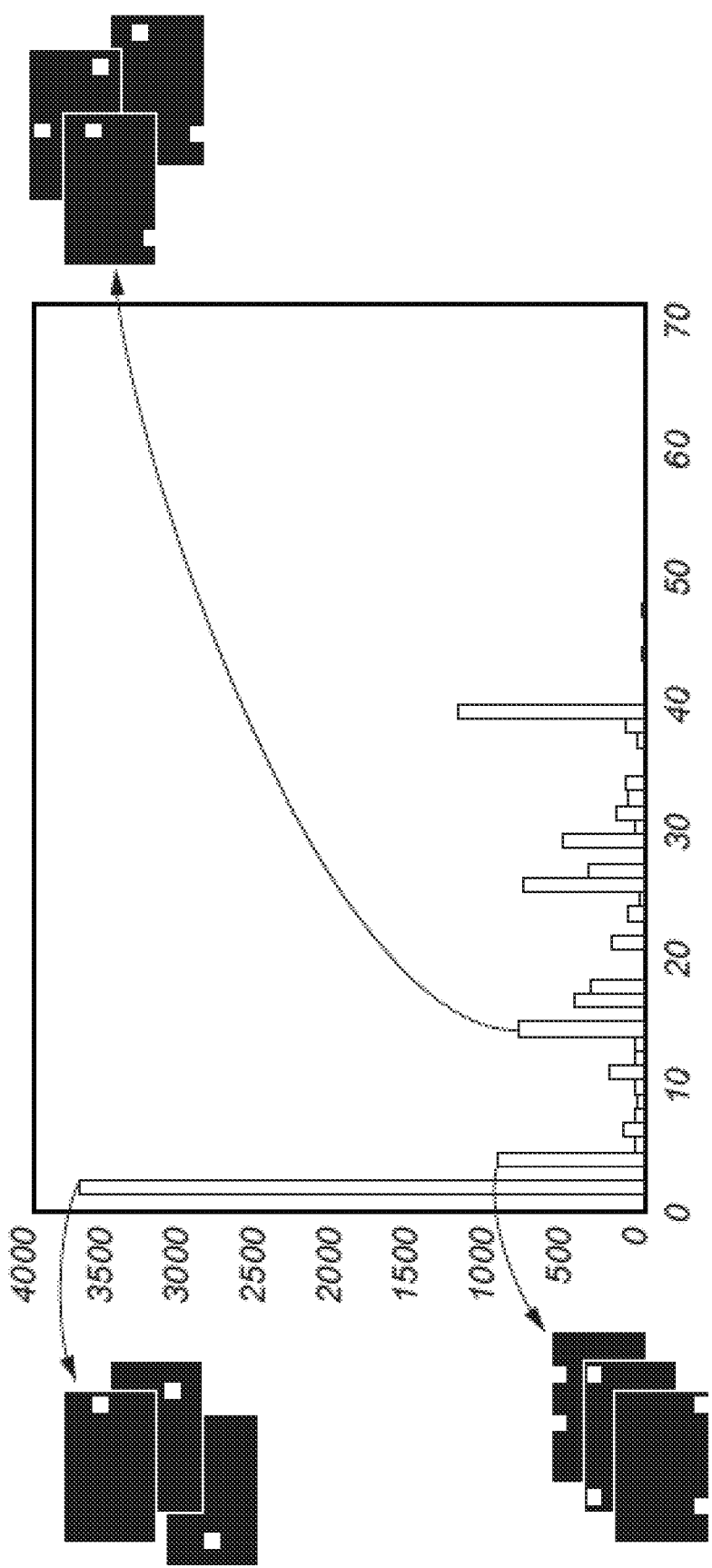
FIG. 4 shows major patterns of a design layout, according to an example embodiment.
Figure 5:
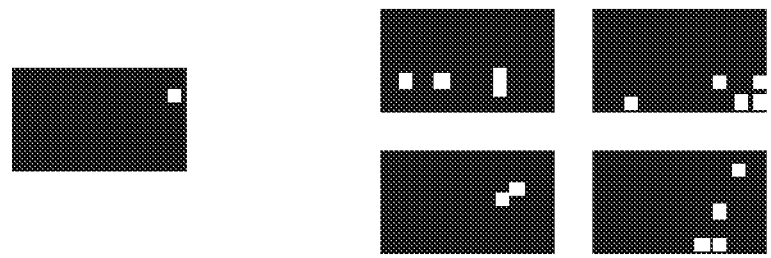
FIG. 5 shows minor patterns of a design layout, according to an example embodiment.

As shown in FIG. 4, major patterns may typically correspond to, for example, isolated vias, vertical or diagonal two vias. As shown in FIG. 5, minor patterns could be formed by a slightly large via or too close vias.

The design analysis may also comprise image based verification of the design. Reconstructed images (or portions of the binary image) may be processed in order to perform physical verifications on the features in the images, such as performing measurements of lengths and sizes of features of the design layout in the image. The physical verifications may further be based on rules for MRC and/or DRC so that a check of the design based on these rules may be performed. The design analysis may thus also provide an output based on whether MRC/DRC is not met and, hence, a recommendation to re-design may be received based on failure to pass any of these checks.

Referring now to FIGS. 6a-8, details of the steps for analyzing a design layout will be further provided.

Figure 6A:
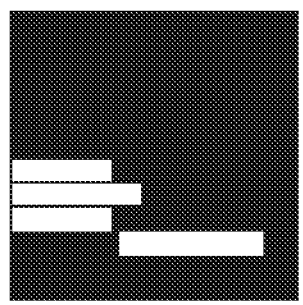
FIG. 6a shows a cut image of a portion of a design, according to an example embodiment.

FIG. 6a illustrates a cut portion from a binary image of a layer of the design layout. The size of the cut portion may be set dependent on the layer of the design layout, so as to enable properly analyzing the design. In an example, the size may be set based on a predicted density of features in the design based on which layer is to be analyzed. The size of the cut portion may also be tuned or changed (e.g., based on input from a user).

Further, the images may be arranged to overlap so that a feature will not be arranged solely at an edge of an image, but may also be arranged at a center of another image formed by cutting the binary image. For instance, a translation of a window (corresponding to the cut image) between two cut images may be half a size of the window.

Figure 6B:
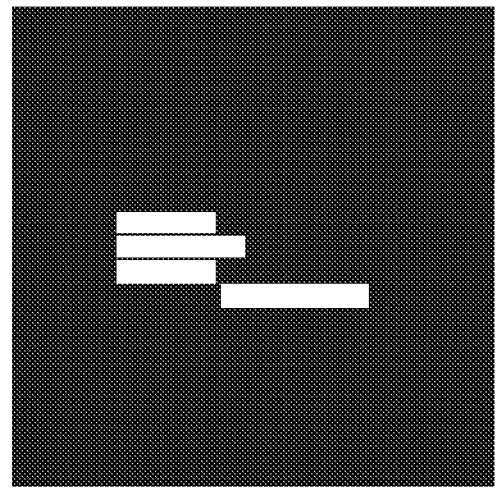
FIG. 6b shows the cut image of FIG. 6a after zero-padding, according to an example embodiment.

The cut image representing a portion of the design layout may optionally be expanded using zero-padding, i.e. by adding a frame of zeros around the cut image, as illustrated in FIG. 6b. A zero-padded image may simplify Fourier transforming of the image.

The cut image, zero-padded or not, may be periodically repeated before Fourier transforming of the image. The periodical repetition of the image may ensure that an emphasis of the features in the cut image is provided in the Fourier transform.

The images formed as discussed above (with or without zero-padding and/or periodically repeated or not) thus each represent a portion of the design layout. Each of the formed images may then be Fourier transformed in order to create a Fourier transform representation of the image. The Fourier transform representation may be generated using a FFT algorithm for quickly calculating the Fourier transform.

Figure 7A:
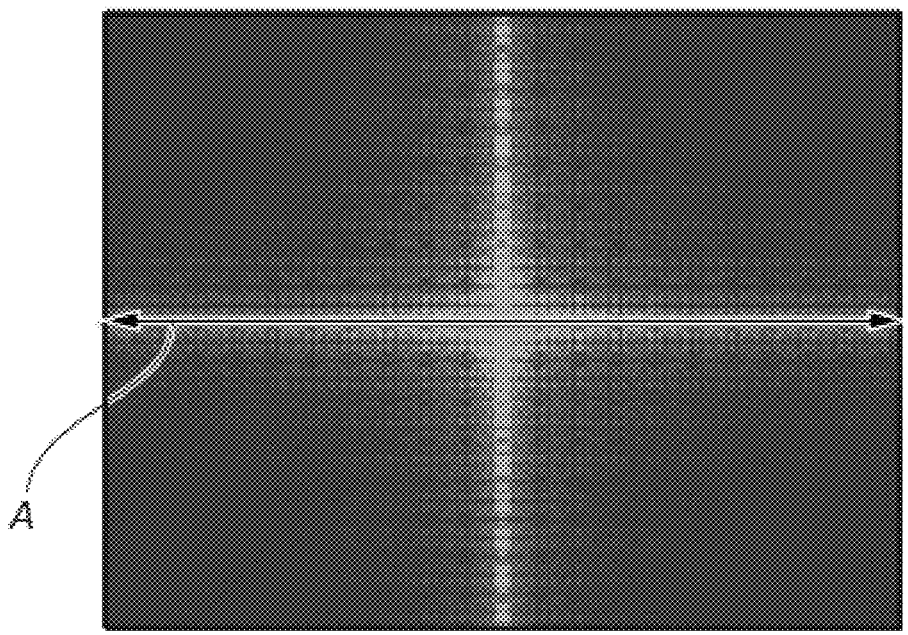
FIG. 7a shows a Fourier transform of an image of a portion of the design, according to an example embodiment.
Figure 7B:
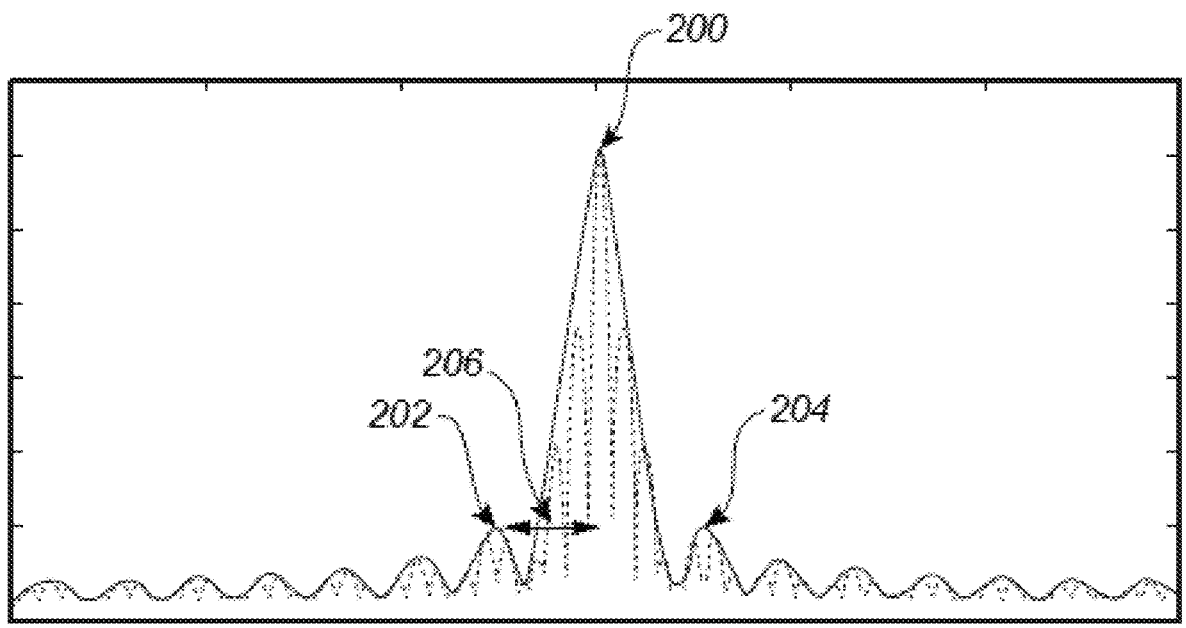
FIG. 7b shows an envelope of a cross-section of the Fourier transform in FIG. 7a, according to an example embodiment.

Referring now to FIGS. 7a-b, parameters may be extracted from the Fourier transform representation. The Fourier transform representation is a two-dimensional representation in frequency domain of an image. The two-dimensional representation may be in Cartesian coordinates or polar coordinates.

In FIG. 7a, a Fourier transform representation of an image is illustrated. One or more lines through the origin of the coordinate plane may be defined, as illustrated by line A in FIG. 7a. The line forms a cross-section in the Fourier transform representation. In an example embodiment, at least one line along an axis of the coordinate plane may be used. The values of the Fourier transform along the line forms a complex signal of the Fourier transform in one dimension, as illustrated by the solid line in FIG. 7b.

An envelope may be formed of the Fourier transformation representation along the defined line, as illustrated by the dotted line in FIG. 7b. The envelope may then be used in order to extract parameters of the Fourier transform representation, which may be used for evaluating the image.

It should be understood that various parameters may be extracted. According to an embodiment, one or more of the following parameters may be extracted: an intensity of a zeroth order peak 200 of the envelope; an intensity of a first order peak 202, 204 of the envelope; a distance 206 between a first order peak 202, 204 and the zeroth order peak 200;

intensities and positions of small peaks from higher orders; and intensities and positions of local peaks within an order of the envelope, such as local peaks within the zeroth order.

It should be realized that for a cross-sectional line in the Fourier transform representation, two first order peaks are defined (on each side of the zeroth order). Thus, by forming envelopes for cross-sectional lines extending along each axis in the two-dimensional Fourier transform representation, four first order peaks may be evaluated and, hence, nine parameters may be extracted based on the intensity of the zeroth order peak 200 and the intensity and position of the first order peaks. According to an embodiment, these nine parameters are extracted and used in analysis of the images.

Figure 8:
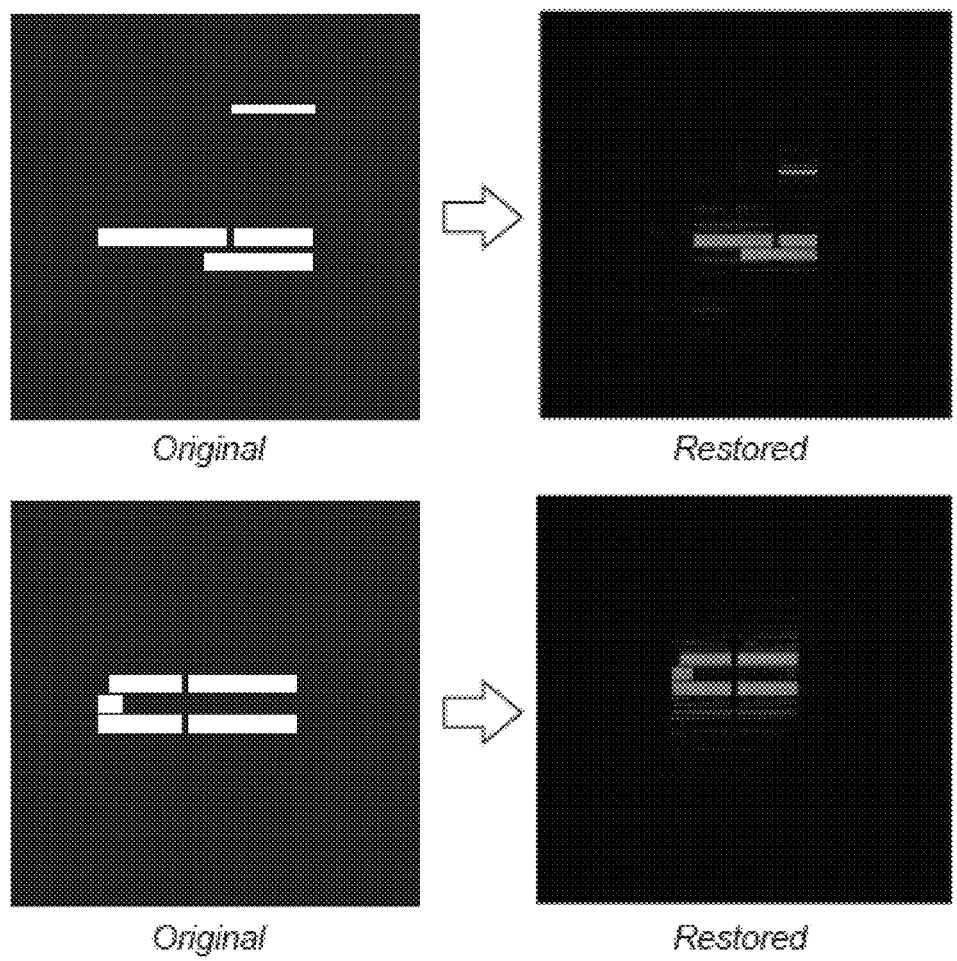
FIG. 8 shows binary images and corresponding images reconstructed from parameters extracted from the Fourier transform, according to an example embodiment.

The extracted parameters may also be used for reconstructing an image. Since the extracted parameters are used in further analysis of the design layout, the extracted parameters may be easily available and, hence, may be used for calculating a reconstructed image that may be used for visualization or image-based analysis of the pattern. In FIG. 8, original binary images are presented on a left part of the image and reconstructed images based on the extracted parameters from the envelopes are presented on a right part of the image. As is clear from FIG. 8, the reconstructed image is very similar to the original binary image.

The extracted parameters from each image may then be provided as input to unsupervised machine learning. The unsupervised machine learning may be configured to find clusters in the extracted parameters, such that a structure based on unlabeled data is formed.

The extracted parameters for each image may be inserted into a parameter matrix that may be column-wise normalized. Then, the unsupervised machine learning may perform clustering of the images based on the parameter matrix.

There are many different manners of forming clusters based on a dataset. For instance, k-means clustering, distribution based clustering (e.g., using regression), density-based clustering or a principal components analysis may be used. The clustering method may also use a support vector machine in addition to the clustering made by unsupervised machine learning.

The clustering will sort images into different clusters such that a distribution of images in the different clusters may be used for presentation of a measure of the design layout to the designer.

The clustering may be based on weights of the parameters in order to set importance of the parameters to the clustering. The weights may be varied in order to analyze the images from different perspectives.

Clustering may be made based on first weights and a result may be presented to the designer (e.g., by visualization of a histogram). The designer may then request to change weighting of the parameters, an updated clustering may be performed based on the changed parameters and again visualized by presentation to the designer.

The designer may decide which types of characteristics are important, such as feature size, density of features, or shape of features. The designer may choose one such characteristic that is of particular interest in the clustering and, then, appropriate weights (pre-stored) based on such desired characteristic may be used in the clustering.

Figure 9:
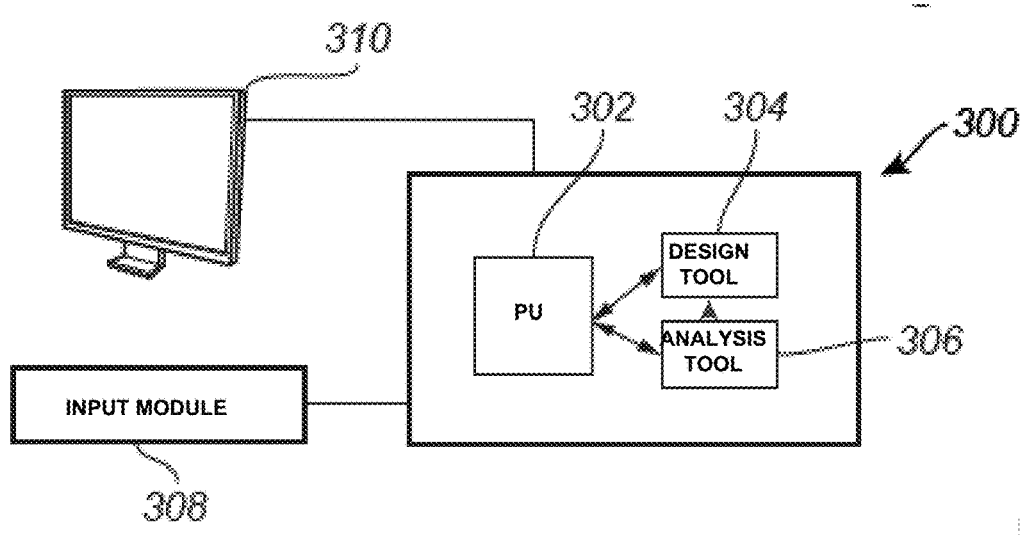
FIG. 9 is a schematic view of a device, according to an example embodiment.

Referring now to FIG. 9, a device 300 for designing of an integrated circuit is illustrated. The device 300 may comprise a processing unit (PU) 302, which may execute computer-readable instructions for designing a layout of an integrated circuit and for analyzing the layout.

The device 300 may thus implement the method as described above and may provide a design tool 304 and an analysis tool 306 to be available to a designer. The device 300 may provide an input module 308, using e.g. a keyboard, a mouse, etc., for allowing input of instructions, controlling and interacting with the design tool 304 and the analysis tool 306. The device 300 may further comprise a display 310 for presenting information to the designer, such as visualization of the analysis performed by the analysis tool 306.

The execution of computer-readable instructions for the design tool 304 and the analysis tool 306 disclosed herein may be implemented in electronic hardware, computer software, or combinations of both. To clearly illustrate this interchangeability of hardware and software, various illustrative components, blocks, and steps have been described above generally in terms of their functionality. Whether such functionality is implemented as hardware or software depends upon the particular application and design constraints imposed on the overall system.

The execution of computer-readable instructions may, for instance, be implemented as software being executed on a general-purpose computer, as firmware arranged e.g. in an embedded system, or as a specifically designed processing unit, such as an Application-Specific Integrated Circuit (ASIC) or a Field-Programmable Gate Array (FPGA).

The design tool 304 and/or the analysis tool 306 may be provided as instructions stored on a computer-readable medium, which may comprise memory or data storage media, such as random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like.

In the above, the disclosed concept has mainly been described with reference to a limited number of examples. However, as is readily appreciated by a person skilled in the art, other examples than the ones disclosed above are equally possible within the scope of the disclosure.

For instance, visualization of the clustering of images may present only parts of the clustering information, such as only information on number of clusters for minor patterns, and the number of images sorted into each of these clusters.

As used herein, the terminology "may" (e.g., may comprise, may be performed, may be represented, etc.) should be understood as meaning that in an example embodiment, the method or system comprises that described feature (e.g., comprises, performs, is represented, etc.).

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for analyzing design of an integrated circuit, the method comprising:
  receiving a design layout for an integrated circuit;
  forming a plurality of images of portions of the design layout, and for each image of a portion of the design layout:

calculating a Fourier transform representation of the image; and extracting values of pre-defined parameters from the Fourier transform representation;

comparing the extracted values of pre-defined parameters of the plurality of images to create a clustering model by unsupervised machine learning and to sort each image of a portion of the design layout into a cluster defined by the clustering model;

determining a number of images sorted into at least one cluster defined by the clustering model; and calculating at least one quality score of the design layout based on the clustering model and the determined number of images sorted into the at least one cluster.

2. The method according to claim 1, wherein the at least one quality score is based on a number of clusters in the clustering model and a density value of a determined number of images in each cluster.

3. The method according to claim 1, further comprising:
comparing the at least one quality score to at least one pre-defined threshold; and
based on a result of the comparison, outputting a recommendation to re-design the design layout for the integrated circuit.

4. The method according to claim 1, further comprising outputting the determined number of images for presentation in a diagram on a display.

5. The method according to claim 1, further comprising:
reconstructing an image based on the extracted values of pre-defined parameters by calculating an inverse Fourier transform using the extracted values of pre-defined parameters; and
outputting the reconstructed image for presentation on a display.

6. The method according to claim 1, wherein comparing the extracted values of pre-defined parameters comprises applying different parameter weights for different parameters, and wherein the method further comprises:
receiving input for changing parameter weights and repeating comparing the extracted values of pre-defined parameters based on the different parameter weights.

7. The method according to claim 1, wherein calculating a Fourier transform representation of the image comprises forming at least one envelope along a cross-sectional direction intersecting origin of a two-dimensional Fourier transform of the image.

8. The method according to claim 7, wherein the pre-defined parameters include at least one in the group of: a zeroth order intensity of the at least one envelope, a first order intensity of the at least one envelope, and a distance between a peak of the zeroth order and a peak of the first order of the at least one envelope.

9. The method according to claim 1, wherein forming of a plurality of images of portions of the design layout comprises forming a binary image of a layer of the design layout.

10. The method according to claim 9, wherein forming of a plurality of images of portions of the design layout further comprises cutting the binary image into a plurality of images of portions of the binary image.

11. The method according to claim 10, wherein cutting the binary image into a plurality of images of portions of the binary image forms overlapping images with a size of the images being dependent on the layer of the design layout.

12. The method according to claim 10, wherein forming of a plurality of images of portions of the design layout further comprises enlarging a size of a cut image by zero-padding.

13. A computer program product comprising a non-transitory computer-readable medium having computer-readable instructions stored thereon that, in response to execution by a processing unit, cause the processing unit to perform operations, the instructions comprising:
instructions for receiving a design layout for an integrated circuit;
instructions for forming a plurality of images of portions of the design layout, and for each image of a portion of the design layout:
(i) calculating a Fourier transform representation of the image; and
(ii) extracting values of pre-defined parameters from the Fourier transform representation;
instructions for comparing the extracted values of pre-defined parameters of the plurality of images to create a clustering model by unsupervised machine learning and to sort each image of a portion of the design layout into a cluster defined by the clustering model;
instructions for determining a number of images sorted into at least one cluster defined by the clustering model; and
instructions for calculating at least one quality score of the design layout based on the clustering model and the determined number of images sorted into the at least one cluster.

14. A device for designing of an integrated circuit, the device comprising:
a processing unit configured to execute processing instructions to implement:
a design tool for designing a layout for an integrated circuit and outputting a design layout; and
a design analytics tool, wherein the design analytics tool is configured to:
receive a design layout for an integrated circuit;
form a plurality of images of portions of the design layout, and for each image of a portion of the design layout:
calculate a Fourier transform representation of the image; and
extract values of pre-defined parameters from the Fourier transform representation;
compare the extracted values of pre-defined parameters of the plurality of images to create a clustering model by unsupervised machine learning and to sort each image of a portion of the design layout into a cluster defined by the clustering model;
determine a number of images sorted into each cluster defined by the clustering model; and
calculate at least one quality score of the design layout based on the clustering model and the determined number of images sorted into each cluster.

15. The device of claim 14, further comprising:
an input module configured to receive instructions for controlling the design tool and the design analytics tool.

16. The device of claim 14, further comprising:
a display configured to output the determined number of images for presentation in a diagram.

17. The device of claim 16, wherein the design analytics tool is further configured to reconstruct an image based on the extracted values of pre-defined parameters by calculating an inverse Fourier transform using the extracted values of pre-defined parameters, and wherein the display is further configured to output the reconstructed image.

18. The device of claim 14, wherein the at least one quality score is based on a number of clusters in the clustering model and a density value of a determined number of images in each cluster.

* * * * *